(12) United States Patent
Hashimoto

(10) Patent No.: US 6,545,499 B2
(45) Date of Patent: Apr. 8, 2003

(54) SEMICONDUCTOR MANUFACTURING-AND-INSPECTION SYSTEM, AND SEMICONDUCTOR DEVICE

(75) Inventor: Osamu Hashimoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/873,395

(22) Filed: Jun. 5, 2001

(65) Prior Publication Data

US 2002/0067182 A1 Jun. 6, 2002

(30) Foreign Application Priority Data

Dec. 1, 2000 (JP) ........................................ 2000-366944

(51) Int. Cl.[7] .............................................. G01R 31/26
(52) U.S. Cl. ..................... 324/765; 324/760; 324/158.1
(58) Field of Search ................................ 324/765, 760, 324/158.1, 763; 714/716, 712; 438/14, 17

(56) References Cited

U.S. PATENT DOCUMENTS 5,327,076 A * 7/1994 Bailey ..................... 324/158.1
5,390,129 A * 2/1995 Rhodes ..................... 324/158.1

FOREIGN PATENT DOCUMENTS

JP          11-145213          5/1999

* cited by examiner

Primary Examiner—Kamand Cuneo
Assistant Examiner—Tung X. Nguyen
(74) Attorney, Agent, or Firm—McDermott, Will & Emery

(57) ABSTRACT

The peak of the current dissipated by semiconductor devices is dispersed and suppressed to a level below the current supply capability of a burn-in apparatus. As a result, there is obtained a semiconductor manufacturing-and-inspection apparatus which enables easy performance of a burn-in test without involvement of anomalies arising in the burn-in apparatus or limitations on the number of semiconductor devices mounted on the burn-in board. A semiconductor manufacturing-and-inspection system, which tests semiconductor devices provided in a plurality of areas on a burn-in board through use of a burn-in apparatus, includes a driver for supplying a drive signal to the semiconductor devices provided in the plurality of areas, a delay circuit which is provided for one of a plurality of drive signals output from the signal generation apparatus and delays the drive signal relative to the other drive signal; and a driver for controlling the delaying operation of the delay apparatus.

9 Claims, 3 Drawing Sheets

SEMICONDUCTOR MANUFACTURING-AND-INSPECTION SYSTEM, AND SEMICONDUCTOR DEVICE

BACKGROUND OF THE INVENTION

1. Field of the Invention

The present invention relates to a semiconductor manufacturing-and-inspection system, and more particularly, to a semiconductor manufacturing-and-inspection system suitable for use in subjecting semiconductor devices mounted on a burn-in board to a burn-in test, as well as to a semiconductor device manufactured through use of the semiconductor manufacturing-and-inspection system.

2. Background Art

In general, a semiconductor manufacturing-and-inspection system sometimes employs a test mode during a process for testing semiconductor devices or an accelerated test (i.e., a burn-in test) to be effected in a reliability test, in order to shorten a burn-in time. For instance, although usually only one circuit is activated during a test, a plurality of circuits are simultaneously activated through use of a test mode. Accordingly, the number of circuits to be activated per unit time is increased, thus shortening a burn-in period.

In this case, all semiconductor devices mounted on a burn-in board a reactivated simultaneously. Hence, a indicated by solid line "a" shown in FIG. 6, the amount of current dissipated by a semiconductor device becomes large and exceeds the current supply capability of a burn-in apparatus. As a result, anomalies arise in the burn-in apparatus, or a limitation is imposed on the number of semiconductor devices to be mounted on the burn-in board.

As a countermeasure against such problems, Japanese Patent Application Laid-Open No. 145213/1999 describes use of a burn-in timer circuit provided in a semiconductor device, in order to reduce the current which flows instantaneously when a plurality of chips operate at the same timing during full wafer measurement and inspection operations. A burn-in operation cycle is determined by apparatus of a clock cycle of the burn-in timer circuit. Since variations in manufacturing process parameter result in variations in clock cycle in different locations over a wafer, a clock cycle differs from one semiconductor chip to another. Hence, an electric current flowing instantaneously during a burn-in test can be diminished.

However, an apparatus employing such a related-art technique involves incorporation of a burn-in timer circuit in a semiconductor device. Hence, the area occupied by semiconductor chips becomes larger, and the number of semiconductor chips which can be manufactured from a single wafer is diminished.

SUMMARY OF THE INVENTION

The present invention has been conceived to solve the drawback of the related-art technique and is aimed at providing a semiconductor manufacturing-and-inspection system which readily enables conduction of a burn-in test without imposing a limitation on the number of semiconductor devices to be mounted on a burn-in board, as well as a semiconductor device manufactured through use of the apparatus.

According to one aspect of the present invention, a semiconductor manufacturing-and-inspection system which tests semiconductor devices provided in a plurality of areas on a burn-in board through use of a burn-in apparatus comprises signal generation apparatus for supplying a drive signal to the semiconductor devices provided in the plurality of areas, delay apparatus which is provided for one part a plurality of drive signals output from the signal generation apparatus and delays the part of drive signals relative to the other part of drive signals, and control apparatus for controlling the delaying operation of the delay apparatus.

According to the present invention, the peak of the current dissipated by the semiconductor devices is dispersed and can be suppressed to a level below the current supply capability of the burn-in apparatus. Hence, there is eliminated a necessity for modifying a delay provided in a determination system of the burn-in apparatus. A burn-in test can be readily performed without involvement of anomalies arising in the burn-in apparatus or limitations on the number of semiconductor devices mounted on the burn-in board.

According to another aspect of the present invention, a semiconductor device is manufactured through use of the semiconductor manufacturing-and-inspection system described above.

The present invention provides an advantage of the ability to provide a highly-reliable semiconductor device of high quality.

Other and further objects, features and advantages of the invention will appear more fully from the following description.

DETAILED DESCRIPTION OF THE PREFERRED EMBODIMENTS

Preferred embodiments of the present invention will be described by reference to the accompanying drawings.

First Embodiment

Figure 1:
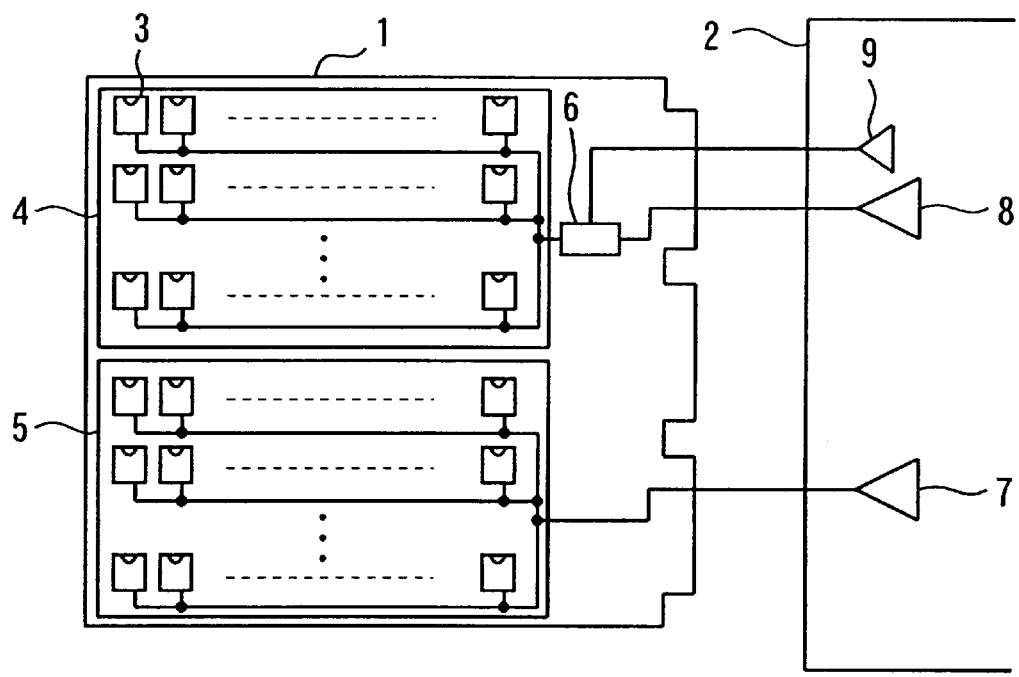
FIG. 1 is a schematic diagram showing the configuration of a semiconductor manufacturing-and-inspection system according to a first embodiment of the present invention.

FIG. 1 is a schematic diagram showing the configuration of a semiconductor manufacturing-and-inspection system according to a first embodiment of the present invention.

In the drawing, reference numeral 1 designates a burn-in board; 2 designates a burn-in apparatus; 3 designates semiconductor devices to be mounted on the burn-in board 1; 4 and 5 designate areas in which the semiconductor devices 3 are mounted; 6 designates a delay circuit which is mounted on the burn-in board 1 and for example, is electrically connected to the semiconductor devices 3 mounted in the area 4; and 7 designates a driver which is provided in the burn-in apparatus 2 and supplies a drive signal to the semiconductor devices 3 mounted in the area 5 on the burn-in board 1.

Reference numeral 8 designates a driver which is provided in the burn-in apparatus 2 and supplies a drive signal to the semiconductor devices 3 mounted in the area 4 on the burn-in board 1, by way of the delay circuit(means) 6; and 9 designates a driver which is provided in the burn-in apparatus 2 and acts as control apparatus (means) for supplying a delay control signal to the delay circuit 6 mounted on the burn-in board 1. Drivers 7 and 8 constitute signal generation apparatus(means) for supplying drive signals to the semiconductor devices 3.

The operation of the semiconductor manufacturing-and-inspection system according to the present invention will now be described by reference to FIGS. 2 through 4.

Figure 2:
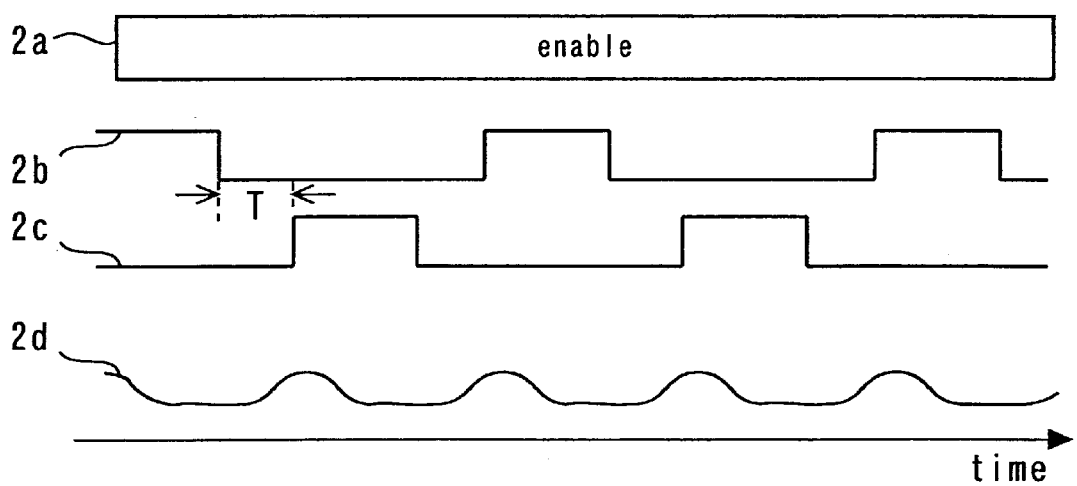
FIG. 2 is a timing chart showing the operation of the semiconductor manufacturing-and-inspection system according to the present invention.
Figure 3:
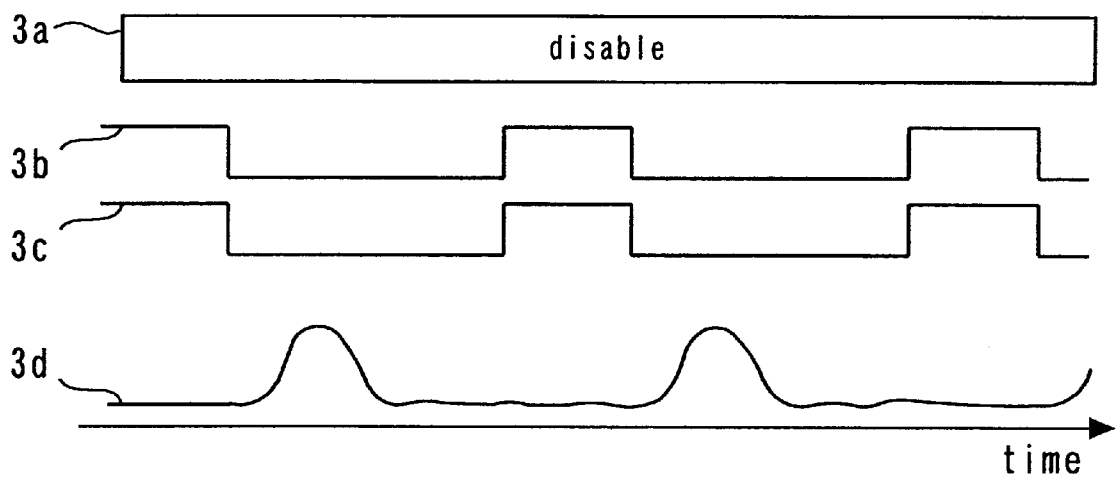
FIG. 3 is a timing chart showing the operation of the semiconductor manufacturing-and-inspection system according to the present invention.

At the time of a burn-in test, the driver 7 of the burn-in apparatus 2 issues a drive signal 2b such as that shown in FIG. 2. The thus-issued drive signal is delivered directly to the semiconductor devices 3 mounted in the area 5 on the burn-in board 1. In contrast, the driver 8 of the burn-in apparatus 2 supplies an analogous drive signal to the semiconductor devices 3 mounted in the area 4 on the burn-in board 1. As shown in FIG. 2, the driver 9 outputs a high-level delay control signal 2a(i.e., an enable signal) to the delay circuit 6 for delaying a drive signal to be input to the semiconductor devices 3 mounted in the area 4 from the driver 8. As shown in FIG. 2, the drive signal 2c that has been delayed by only a predetermined period of time T is supplied from the driver 7 to the semiconductor devices 3 mounted in the area 4 on the burn-in board 1.

Consequently, the semiconductor devices 3 mounted in the area 4 on the burn-in board 1 operate at a timing different from that at which the semiconductor devices 3 mounted in the area 5 on the same operate. As shown in FIG. 2, the peak of the current 2d dissipated by the semiconductor devices 3 can be dispersed.

Figure 4:
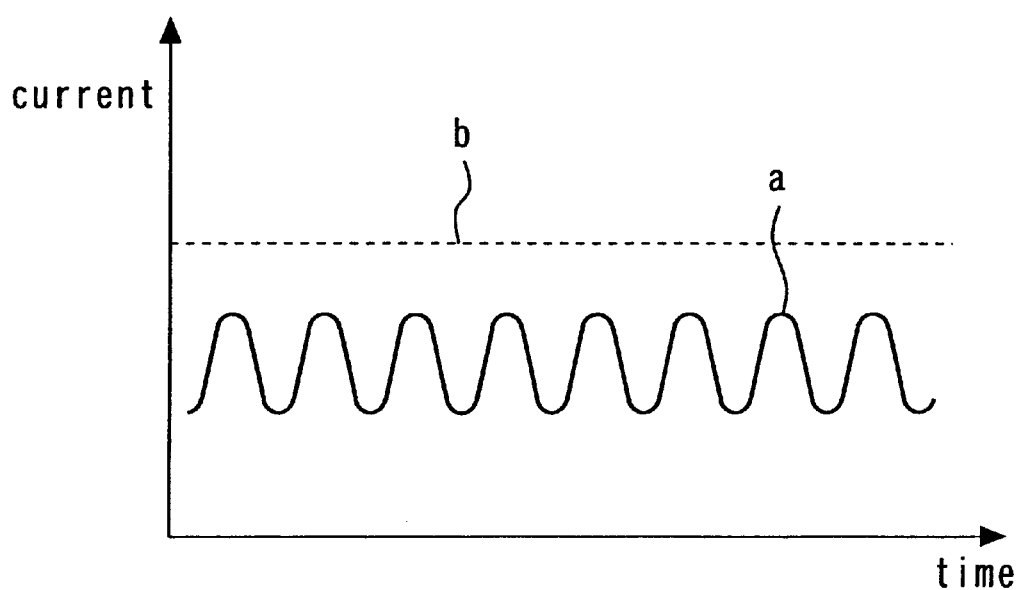
FIG. 4 shows the relationship between the current supply capability of the burn-in apparatus and the current dissipated by the semiconductor devices according to the present invention.

FIG. 4 shows the relationship between the current supply capability of the burn-in apparatus 2 and the current dissipated by the semiconductor devices 3. The current which is to be dissipated by the semiconductor devices 3 and is designated by solid line "a" is lower than the current supply capability of the burn-in apparatus 2 designated by broken line "b" shown in FIG. 4. The current dissipated by the semiconductor devices 3 is understood to be suppressed so as to become lower than the current supply capability of the burn-in apparatus 2.

In a case where current consumption does not pose a problem in a situation other than a burn-in test; for example, where there is performed a function test to be performed by the burn-in apparatus 2 having a test function, the function test is performed by apparatus of the driver 9 outputting a low-level delay control signal (i.e., a disable signal) to the delay circuit 6, for preventing delay in a drive signal to be input to the semiconductor devices 3 mounted in the area 4 from the driver 8. In this case, the drivers 7 and 8 output in-phase drive signals 3b, 3c such as those shown in FIG. 3. At this time, the current 3d dissipated by the semiconductor devices 3 mounted on the burn-in board 1 assumes a waveform such as that shown in FIG. 3.

In the present embodiment, a delay circuit is provided on the burn-in board, thereby activating semiconductor devices provided in a plurality of areas on a burn-in board at different timings. Accordingly, the peak of the current dissipated by the semiconductor devices is dispersed and can be suppressed to a level below the current supply capability of the burn-in apparatus. Hence, there is eliminated a necessity for modifying a delay provided in a determination system of the burn-in apparatus. A burn-in test can be readily performed without involvement of anomalies arising in the burn-in apparatus and limitations on the number of semiconductor devices mounted on the burn-in board.

Second Embodiment

Figure 5:
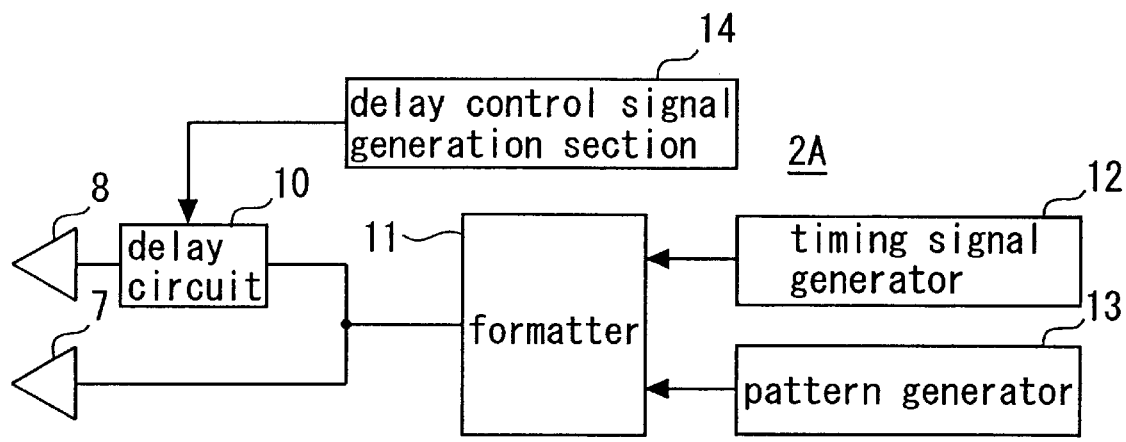
FIG. 5 is a schematic diagram showing the configuration of a semiconductor manufacturing-and-inspection system according to a second embodiment of the present invention.
Figure 6:
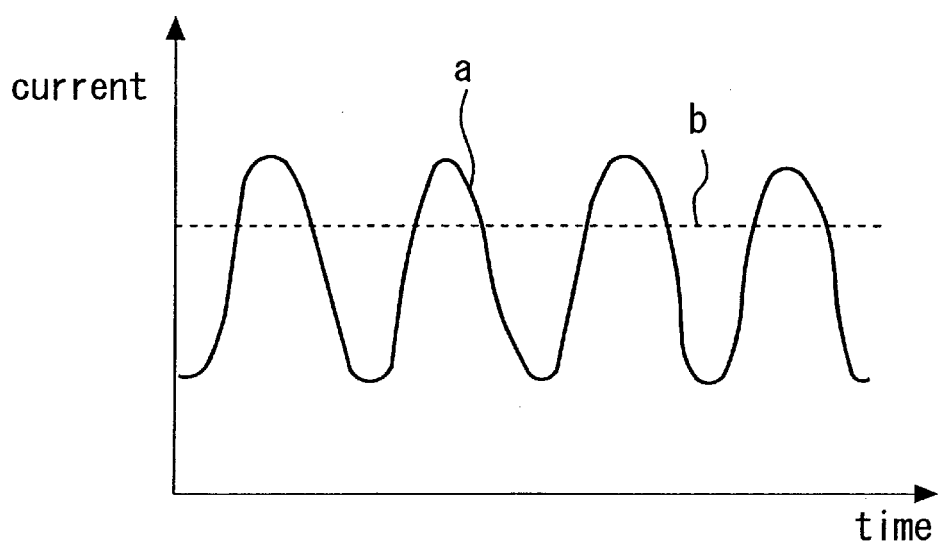
FIG. 6 shows the relationship between the current supply capability of the burn-in apparatus and the current dissipated by the semiconductor devices according to the prior art.

FIG. 5 is a block diagram showing the configuration of a semiconductor manufacturing-and-inspection system according to a second embodiment of the present invention. In FIG. 5, those elements which are identical with those shown in FIG. 1 are assigned the same reference numerals, and repetition of their detailed explanations is omitted.

In the drawing, reference numeral 2A designates a burn-in board apparatus; 10 designates a delay circuit which is provided in the burn-in board apparatus 2A and connected to an input terminal of the driver 8 which outputs a drive signal to the semiconductor devices 3 mounted in, for example, the area 4; 11 designates a formatter connected to the delay circuit 10 and the input terminal of the driver 7; 12 designates a timing signal generator for outputting a timing signal to the formatter 11; and 13 designates a pattern generator for generating a test pattern signal to be output to the formatter 11.

Reference numeral 14 designates a delay control signal generation section which acts as control apparatus(means) for generating a delay control signal and can be controlled by apparatus(means) of a medium capable of being readily and arbitrarily set, such as a program. The medium of the delay control signal generation section 14 may be embodied as software or hardware so as to include, for example, a test program. For this reason, in the first embodiment, the delay circuit for delaying the drive signal output from the driver 8 is provided on the burn-in board 1. In contrast, in the second embodiment, the delay circuit is provided in the burn-in apparatus 2A. The delay circuit 10 is controlled by the delay control signal which has been produced in the burn-in apparatus 2A and output by way of the delay control signal generation section 14. In other respects, the semiconductor manufacturing-and-inspection system is identical in construction with the semiconductor manufacturing-and-inspection system shown in FIG. 1.

Operation of the semiconductor manufacturing-and-inspection system according to the second embodiment will now be described by reference to FIGS. 2 through 4.

At the time of a burn-in test, the driver 7 of the burn-in apparatus 2A outputs a drive signal 2a such as that shown in FIG. 2. The thus-output drive signal is delivered directly to the semiconductor devices 3 provided in the area 5 on the burn-in board 1. An analogous drive signal is delivered from the driver 8 of the burn-in apparatus 2A to the semiconductor devices 3 provided in the area 4 on the burn-in board 1. As shown in FIG. 2, the delay control signal generation section 14 outputs to the delay circuit 10 a high-level delay control signal 2a(i.e., an enable signal) for delaying the drive signal input to the semiconductor devices 3 provided in the area 4 from the driver 8. Accordingly, as shown in FIG. 2, the drive signal 2c, which has been delayed for only a given period of time T relative to the drive signal output from the driver 7, is supplied to the semiconductor devices 3 provided in the area 4 on the burn-in board 1.

Consequently, the semiconductor devices 3 provided in the area 4 on the burn-in board 1 operate at timings differing from those at which the semiconductor devices 3 provided in the area on the burn-in board 1 operate. As shown in FIG. 2, the peak of the current 2d dissipated by the semiconductor devices can be dispersed.

The relationship between the current supply capability of the burn-in apparatus 2A and the amount of current dissipated by the semiconductor devices 3 can be illustrated in FIG. 4. The amount of current dissipated by the semiconductor devices 3 designated by solid line "a" becomes smaller than the current supply capability of the burn-in apparatus 2A designated by broken lines "b" shown in FIG. 4. The amount of current dissipated by the semiconductor devices 3 is suppressed to a level which is lower than the current supply capability of the burn-in apparatus 2A.

Even in the second embodiment, in a case where current consumption does not pose a problem in a situation other than a burn-in test; for example, where there is performed a function test to be performed by the burn-in apparatus 2A having a test function, the function test is performed by apparatus of the delay control signal generation section 14 outputting a low-level delay control signal (i.e., a disable signal) to the delay circuit 10, for preventing delay in a drive signal to be input to the semiconductor devices 3 mounted in the area 4 from the driver 8. In this case, the drivers 7 and 8 output in-phase drive signals 3b, 3c such as those shown in FIG. 3. At this time, the current 3d dissipated by the semiconductor devices 3 mounted on the burn-in board 1 assumes a waveform such as that shown in FIG. 3.

In the present embodiment, a delay circuit is provided in the burn-in apparatus, thereby activating at different timings semiconductor devices provided in a plurality of areas on a burn-in board. Accordingly, the peak of the current dissipated by the semiconductor devices is dispersed and can be suppressed to a level below the current supply capability of the burn-in apparatus. Hence, there is eliminated a necessity for modifying a delay provided in a determination system of the burn-in apparatus. A burn-in test can be readily performed without involvement of anomalies arising in the burn-in apparatus or limitations on the number of semiconductor devices mounted on the burn-in board.

As mentioned above, the present invention provides a semiconductor manufacturing-and-inspection system which tests semiconductor devices provided in a plurality of areas on a burn-in board through use of a burn-in apparatus, the system comprising:

signal generation apparatus for supplying a drive signal to the semiconductor devices provided in the plurality of areas;

delay apparatus which is provided for one of a plurality of drive signals output from the signal generation apparatus and delays the drive signal relative to the other drive signal; and control apparatus for controlling the delaying operation of the delay apparatus. Accordingly, the peak of the current dissipated by the semiconductor devices is dispersed and can be suppressed to a level below the current supply capability of the burn-in apparatus. Hence, there is eliminated a necessity for modifying a delay provided in a determination system of the burn-in apparatus. A burn-in test can be readily performed without involvement of anomalies arising in the burn-in apparatus or limitations on the number of semiconductor devices mounted on the burn-in board.

According to the present invention, the delay apparatus is provided on the burn-in board, thereby eliminating a necessity for incorporating a burn-in timer circuit into a semiconductor device, which would otherwise be required in the case of the related-art technology. Hence, the present invention yields an advantage of the ability to prevent a decrease in the number of semiconductor chips which can be manufactured from a single wafer.

Since the delay apparatus is provided in the burn-in apparatus, there is no necessity for incorporating a burn-in timer circuit into a semiconductor device, which would otherwise be required in the case of the related-art technology. Hence, the present invention yields an advantage of the ability to prevent a decrease in the number of semiconductor chips which can be manufactured from a single wafer.

The signal generation apparatus and the control apparatus are provided in the burn-in apparatus. Hence, the present invention yields an advantage of the ability to contribute to an increase in the number of chips which can be produced from a single wafer.

The signal generation apparatus is made up of a plurality of drivers, and another driver provided in a burn-in apparatus other than the plurality of drivers is used as the control apparatus. Hence, the present invention yields an advantage of the ability to contribute to an increase in the number of chips which can be produced from a single wafer.

A delay control signal generation section which produces a delay control signal capable of being controlled by apparatus of a medium capable of being easily and arbitrarily set is used as the control apparatus. Hence, the present invention yields an advantage of the ability to contribute to an increase in the number of chips which can be produced from a single wafer.

The control apparatus controls the delay apparatus such that one drive signal is delayed for a given period of time relative to another drive signal at the time of performance of a burn-in test. Hence, the present invention provides an advantage of the ability to disperse the peak of the current dissipated by semiconductor devices and to suppress the same to a level below the current supply capability of a burn-in apparatus.

The control apparatus controls the delay apparatus such that one drive signal becomes in phase with another drive signal at the time of performance of a function test. The present invention provides an advantage of the ability to use a single test apparatus to perform both a function test and a burn-in test by failure-free process.

A semiconductor device can be manufactured through use of the semiconductor manufacturing-and-inspection system set forth. Hence, the present invention provides an advantage of the ability to provide a highly-reliable semiconductor device of high quality.

The entire disclosure of a Japanese Patent Application No. 2000-366944, filed on Dec. 1, 2000 including specification, claims, drawings and summary, on which the Convention priority of the present application is based, are incorporated herein by reference in its entirety.

What is claimed is:

1. A semiconductor manufacturing-and-inspection system which tests semiconductor devices provided in a plurality of areas on a burn-in board through use of a burn-in apparatus, the system comprising:

a signal generation apparatus for supplying drive signals to said semiconductor devices provided in said plurality of areas;

a delay apparatus which is provided for supplying a delayed drive signal to one part of said semiconductor devices and delays one part of said drive signals relative to the other part of said drive signals; and a control apparatus for controlling the delaying operation of said delay apparatus.

2. The semiconductor manufacturing-and-inspection system according to claim 1, wherein said delay apparatus is provided on said burn-in board.

3. The semiconductor manufacturing-and-inspection system according to claim 1, wherein said delay apparatus is provided in said burn-in apparatus.

4. The semiconductor manufacturing-and-inspection system according to claim 3, wherein said signal generation apparatus and said control apparatus are provided in said burn-in apparatus.

5. The semiconductor manufacturing-and-inspection system according to claim 4, wherein said signal generation apparatus is formed from a plurality of drivers, and another driver other than said plurality of drivers disposed in said burn-in apparatus is used as said control apparatus.

6. The semiconductor manufacturing-and-inspection system according to claim 4, wherein a delay control signal generation section which produces a delay control signal capable of being controlled by apparatus of a medium capable of being easily and arbitrarily set is used as said control apparatus.

7. The semiconductor manufacturing-and-inspection system according to claim 1, wherein said control apparatus controls said delay apparatus such that at the time of performance of a burn-in test one drive signal is delayed for a given period of time relative to another drive signal.

8. The semiconductor manufacturing-and-inspection system according to claim 1, wherein said control apparatus controls said delay apparatus such that at the time of performance of a function test one drive signal becomes in phase with another drive signal.

9. A semiconductor device manufactured through use of the semiconductor manufacturing-and-inspection system according to claim 1.

* * * * *